United States Patent [19]

Nightingale et al.

[11] 3,771,872

[45] Nov. 13, 1973

[54] MASK AND APPARATUS USED FOR ALIGNMENT PURPOSES IN PHOTOLITHOGRAPHY

[75] Inventors: Eric Gordon Nightingale, London; Roger Cullis, Cranleigh, both of England

[73] Assignee: The Rank Organisation Limited, London, England

[22] Filed: Dec. 8, 1972

[21] Appl. No.: 313,508

[30] Foreign Application Priority Data

Dec. 8, 1971 Great Britain .................. 56,937/71

[52] U.S. Cl. ........................ 355/125, 96/44, 355/78, 355/133

[51] Int. Cl. .......................................... G03b 27/28

[58] Field of Search .................... 355/125, 122, 133, 355/86, 78; 96/44

[56] References Cited

UNITED STATES PATENTS 3,602,591 8/1971 Bouwer et al. ....................... 355/133

FOREIGN PATENTS OR APPLICATIONS 1,248,564 10/1971 Great Britain

*Primary Examiner*—Richard L. Moses

*Attorney*—Joseph F. Brisebois et al.

[57] ABSTRACT

A mask for use in photolithography and apparatus for using the mask, in which a pattern formed as opaque regions in a transparent mask or as transparent regions in an opaque mask are to be transferred to a photosensitive layer by exposing the photosensitive layer through the mask. Alternatively the photosensitive layer could be exposed to light reflected from the mask if the pattern were formed as variations in the reflectivity of the mask. In order that the mask can be accurately positioned with respect to the photosensitive layer they are both formed with fiducial marks and the fiducial mark on the mask is formed as a plurality of very small elements extending transverse the general line of the fiducial mark and so positioned that diffraction effects at the edges of the elements cooperate to provide a single dense image, that is a single bright image on a dark ground or a single dark image on a bright ground depending on whether the elements are opaque or transparent.

18 Claims, 7 Drawing Figures

MASK AND APPARATUS USED FOR ALIGNMENT PURPOSES IN PHOTOLITHOGRAPHY

The present invention relates to the reproduction of patterns and particularly to the reproduction of a pattern or patterns from a mask to an element adjacent thereto. The present invention finds particular utility in relation to the manufacture of microcircuits and semiconductor devices for such microcircuits.

One particularly useful method used for manufacturing semiconductor devices is the so-called planar technique; semiconductors made by this technique are called planar semiconductor devices, and such devices are produced by successively introducing various impurities into a body of semiconductor material, in patterns determined at each stage by the shape of apertures made in a masking layer formed on the surface of the semiconductor body. The shape of the apertures to be formed in the masking layer at any one stage is transferred to the masking layer most conveniently by a photolithographic process whereby the masking layer is coated with a photoresist which is exposed with a pattern of light the shape of which is determined by a mask. The photoresist is subsequently developed whereupon the unexposed areas are washed away leaving the areas of the masking layer to be removed exposed to the action of an etchant to which the photoresist and the semiconductor material are resistant. When the pattern has been etched through the masking layer the remainder of the photoresist is removed, to leave only the masking layer over the semiconductor body. The appropriate impurities are then introduced into the body of the semiconductor material, for example, by means of a high temperature diffusion process, and subsequently a new masking layer is formed over the surface of the semiconductor or the original layer is renewed where it has been etched away, and a new layer of photoresist is deposited over the masking layer. In order to introduce further impurities into the semiconductor material to cooperate with the first it is necessary to position the subsequent pattern very accurately with respect to the first. The degree of accuracy required is extremely high since the individual features of the semiconductor devices may be as small as 2 - 3 $\mu m$. Because of the small size of each device it is customary to form a considerable number of them simultaneously in rows and columns on a sheet of semiconductor material, each successive pattern being formed individually, however, by a step-and- repeat process either automatically or manually. To assist with alignment of masks and patterns various fiducial marks may be made or deposited on or within the semiconductor.

British Pat. No. 1,248,564 describes a method and apparatus for automatically aligning a mask, which is spaced from a semiconductor body, with fiducial marks on the body during such a process as that described above. For practical reasons it is preferred to employ only one accurately formed master mask to produce the successive patterns on the photoresist, rather than having to align a different mask for each operation. The master mask is accurately formed with all of the successive patterns to be formed on the photoresist, and is used in conjunction with a set of auxiliary masks which blank off the patterns not in use for any given operation. The auxiliary masks thus do not have to be made or positioned to the same critical tolerances as the master, and for this reason are sometimes referred to as non-critical masks. It is still necessary, however, to accurately align the master mask at each successive stage of the process and for this purpose there are provided fiducial marks in the masks of the set used for forming the successive patterns, and cooperating fiducial marks are formed on the masking layer on the semiconductor material being processed. Since the photoresist is most sensitive to shorter wavelength light it is convenient to expose the pattern to be etched using ultra violet light and to use infra red light, in combination with a suitable detection system to check the alignment of the masks by means of the fiducial marks. The detection system described in British Pat. No. 1,248,564 is capable of operating entirely automatically to align fiducial marks on the mask with fiducial marks previously formed on the photoresist on the semiconductor. This is achieved by means of microscopes linked to photoelectric detectors, having control means for receiving signals generated as a result of misalignment between the fiducial marks and operative to produce movement of a mounting device of either the mask or the semiconductor body in dependence on signals from the microscopes and photoelectric detectors, to align the two sets of fiducial marks. The fiducial marks on the mask and on the semiconductor are described in Britisn Patent No. 1248564 as being each in the form of two mutually perpendicular lines in the form of a cross, although it is not essential for the two lines of each fiducial mark to intersect. The marks are viewed by means of an optical system having a screen with a corresponding slit immediately in front of each of a pair of photo-detectors, the light from each fiducial mark being split so that one detector receives light from one line of the fiducial mark and the other detector receives light from the other line of the fiducial mark. The slits in the screens are of such a size and so located that the image on the detector surface is in the form of a diffraction pattern including two relatively bright lines. Misalignment between the fiducial marks on the mask and the fiducial marks on the semiconductor element are detected by vibrating the screens bearing the slits at a frequency and phase determined by a reference voltage which is applied to a demodulating phase-sensitive rectifier. When illumination from the fiducial mark element parallel to the slits in the screen falls upon the slits an oscillatory light signal is transmitted to the respective photoelectric detector and the resultant electrical output is directed through a pre-amplifier to a phase-change unit which applies a predetermined constant correction to compensate for phase lag inherent in the system. The frequency and phase of the signal from the photodetector will vary in dependence upon the misalignment, if any, between the mean position of the slits on the screen and the illumination pattern projected onto the screen. This is compared in the phase-sensitive rectifier with the reference voltage frequency and phase and any resultant error signal is then used to drive a system for moving the mounts of either the mask or the semiconductor element.

It has been found however, that this system is not entirely satisfactory because the illumination of the slit screens in front of the photoelectric detectors does not provide sufficient contrast to determine the precise position of registration entirely unambiguously, due partly to the edge diffraction effects of the slit and the fiducial mark on the mask. As mentioned above, in order to be able to determine the registration position accurately the overall size of the fiducial marks must be small, so small in fact that edge diffraction effects are significant; this, however, leads to a lack of sensitivity in the position detection system as described above.

According to the present invention there is provided a mask bearing a pattern for reproduction on a photosensitive element spaced from the mask by exposing the element to light reflected from or transmitted through the mask, and at least one fiducial mark comprising a plurality of elements so arranged that, when illuminated, the diffraction effects at the edge of each element cooperate to provide a single dense image of the fiducial mark.

The term "dense image" will hereinafter be understood to refer both to a bright image on a dark background, in which the surrounding diffraction pattern does not include any fringes of comparable brightness or intensity as the single central part of the image, and also to a dark image on a light background where the surrounding diffraction pattern does not include any dark fringes of comparable size or contrast with respect to the surrounding illumination.

Preferably the said elements of the fiducial mark are lines arranged parallel and side by side in at least one row extending transverse the direction of the lines. It is preferred, moreover, that the lines are formed as opaque strips in a material transparent to the radiation with which the photosensitive material is to be exposed. In such an embodiment it is preferred that the lines are of such a size and so spaced that, when illuminated, the diffraction patterns of adjacent lines overlap and cancel to produce the said single dense image of the fiducial mark. If it is desired to have the fiducial marks in the mask as transparent portions of an otherwise opaque mask the spacing of the lines may be so arranged that the diffraction pattern of adjacent lines overlap and reinforce to provide a single bright image.

In either case it is preferred that the said lines are inclined with respect to the axis of the said row forming the fiducial mark, and in a preferred embodiment the lines are inclined at substantially 45° to the axis of the row defining the fiducial mark.

Similarly, practical embodiments may be constructed in which the said fiducial marks comprise at least two such rows of lines, the axes of the two rows being substantially perpendicular. In such an embodiment it is preferred that the lines of each row are substantially parallel to the lines of the other row. Although not essential it is preferable that if the fiducial mark comprises two perpendicular rows of lines the two said rows of lines intersect, and if this is the case the point of intersection may be formed, if desired, to have no lines.

As mentioned above the present invention finds particular utility in the manufacture of semiconductor devices by the planar technique where it is desired to reproduce different patterns onto a semiconductor element at different stages of the process, which patterns must be very accurately located with respect to previously formed patterns which, however, may not be visible at the time of forming the successive patterns. Due to the small size of each semiconductor device it is conventional to manufacture a large number of them from a single semiconductor element but, as mentioned above this creates problems of alignment when each semiconductor device is treated individually in the so-called step-and-repeat process. Embodiments of the present invention can be constructed in which fiducial marks in the form of a frame surround each device on a semiconductor element. In this case it is preferred that the sides of each frame abut or form part of the sides of adjacent frame to form a grid covering the whole of the semiconductor element. It is preferred that the pattern to be reproduced does not overlap the lines of the grid pattern of fiducial marks, so that in other words, the pattern to be reproduced is formed solely in the interstices of the grid pattern of fiducial marks.

The present invention also comprehends apparatus for use in the manufacture of planar semiconductors comprising means for mounting an element of semiconductor material bearing a layer of photosensitive material, means for mounting a mask as hereinbefore defined spaced from the said element of semiconductor material in a predetermined relative orientation therewith, means for illuminating the mask with radiation to which the photosensitive layer is insensitive so that light reflected or transmitted through the mask falls onto the element, and means sensitive to the relative positions of the fiducial mark on the mask and a fiducial mark on the element to effect, automatically, alignment of the two said fiducial marks.

In a preferred embodiment the means sensitive to the relative positions of the two fiducial marks includes at least one photoelectric detector in front of which there is located a screen having a fiducial mark corresponding in shape to the shape of the fiducial mark on the mask. The apparatus may also include means for vibrating the screen transverse the direction of incident light and means for providing a reference signal the frequency and phase of which are related to the frequency and phase of vibration of the screen. This embodiment operates in an analogous manner to the apparatus mentioned above and fully described in British Pat. No. 1,248,564.

If the fiducial marks on the mask are in the form of a grid pattern of opaque elements, the fiducial mark on the complementary screen is preferably in the form of a corresponding grid pattern of openings. In this embodiment there is preferably provided a lens between the screen and the photoelectric detector for focusing substantially the whole of the light transmitted through the screen onto the photoelectric detector.

Instead of means for vibrating the slit screen as mentioned above there may be provided a prismatic refractor in the path of the light from the semiconductor element to the screen, and means for rotating the refractor and providing a reference signal the frequency and phase of which is related to the angular velocity and angular position of the refractor. Preferably the prismatic refractor is in the form of a parallel sided plate which is inclined with respect to the direction of incident light from the semiconductor element.

Embodiments of this invention will be described more particularly, by way of example, with reference to the accompanying drawings, in which.

Figures 1, 2:
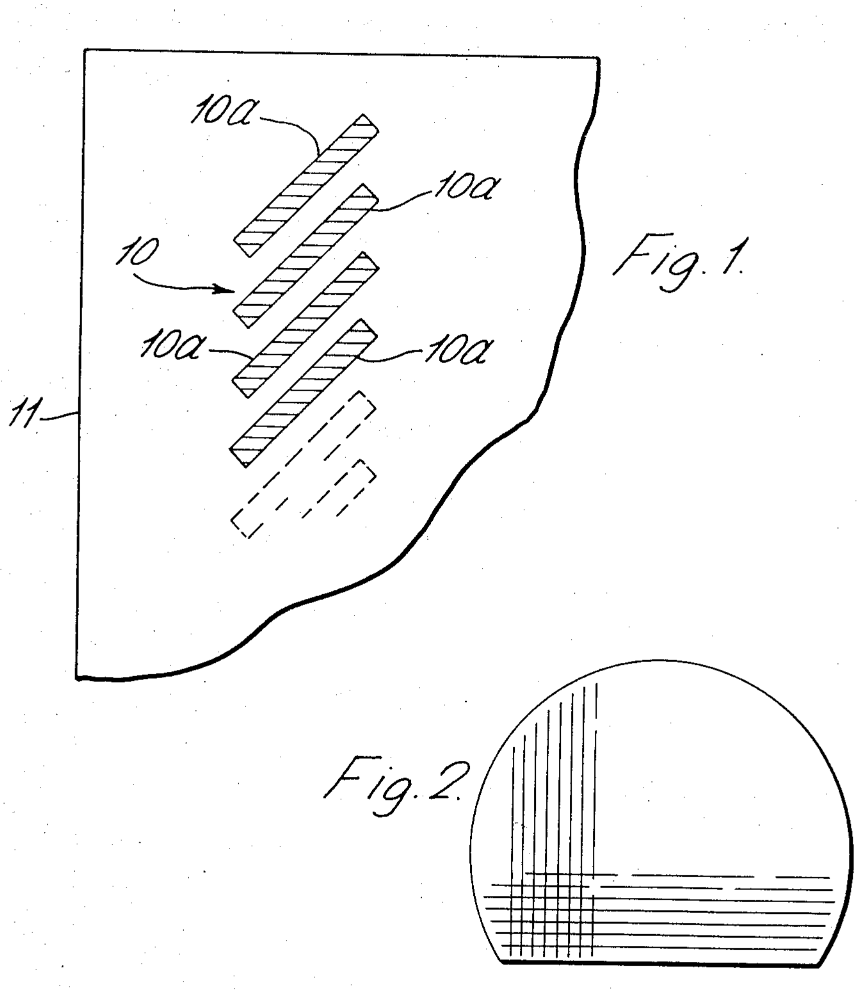
FIG. 1 is an enlarged view of part of a mask constructed as an embodiment of the invention.
FIG. 2 is an enlarged view of part of a mask constructed as an alternative embodiment of the invention.
Figure 4:
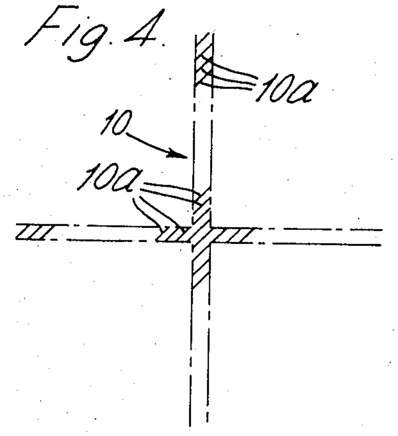
Figure 4A:
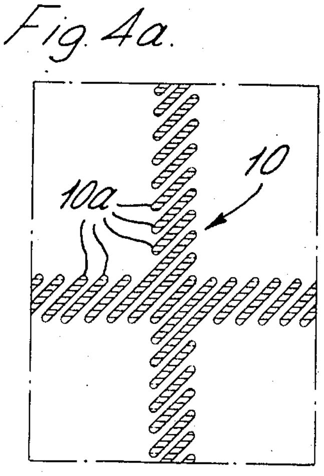
Figure 5:
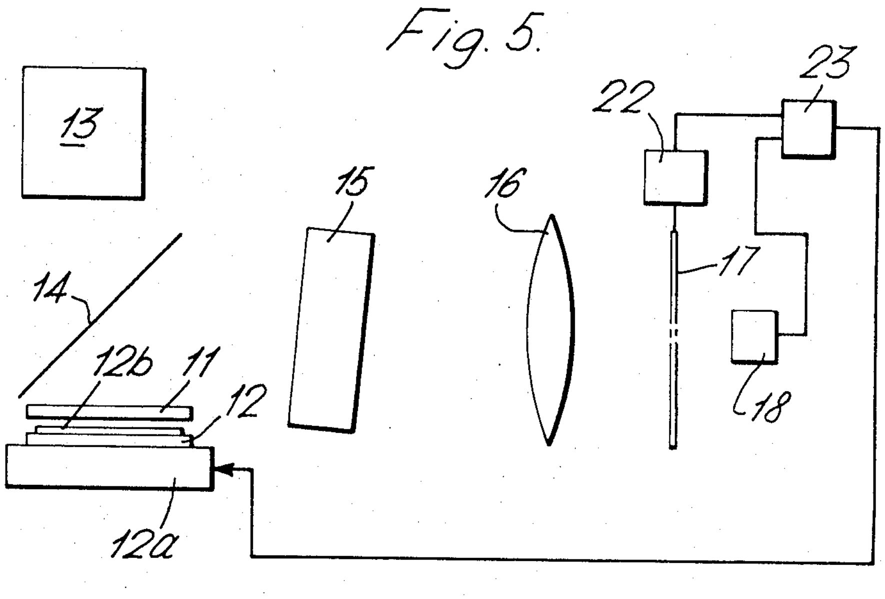
Figure 6:
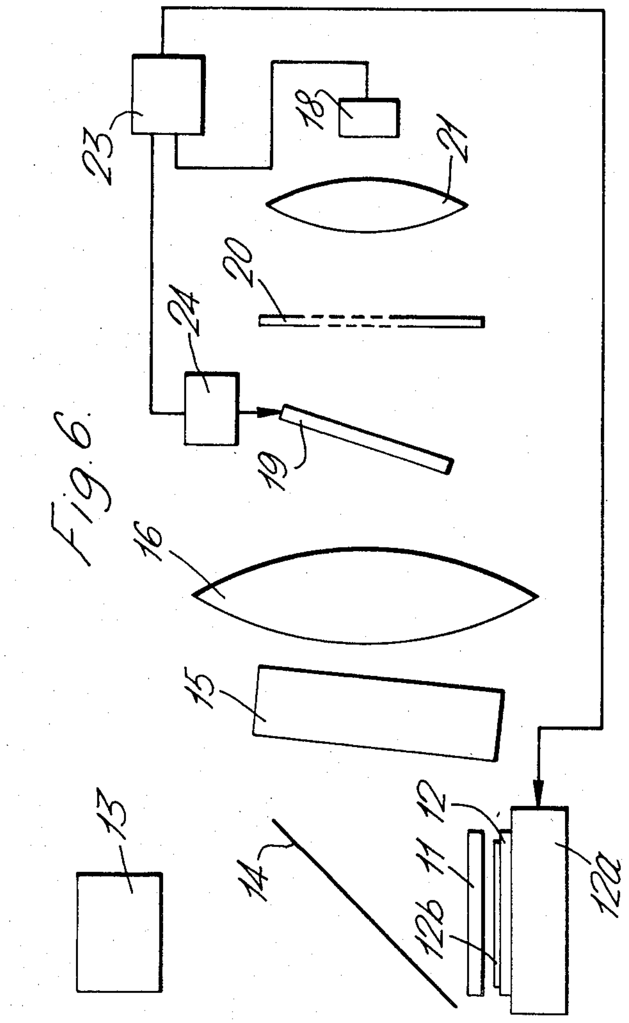

FIGS. 4 and 4*a* are enlarged views of part of a mask constructed as a third embodiment of the invention;

FIG. 5 is a diagrammatic view of apparatus suitable for use with the embodiments of FIGS. 1, 2 or 4; and FIG. 6 is a diagrammatic view of alternative apparatus suitable for use with the embodiments of FIGS. 1, 2 or 4.

Referring now to FIG. 1 there is shown one embodiment of the invention comprising a mask having a fiducial mark in the shape of a single line. The line is composed of elements each arranged at approximately 45° to the general line of the fiducial mark and each separated by a distance substantially equal to the thickness of each element. The magnification in the case of this FIG. 1 is in the region of 1,000 times the true size of the fiducial mark, the transverse elements of the fiducial mark being in the region of four thousandths of a millimetre.

Referring now to FIG. 2 there is shown a mask in which the fiducial marks are in the form of a first set of substantially parallel lines extending across the mask, and a second set of substantially parallel lines extending perpendicular to the first set of lines to form a grid. Each line of the fiducial mark is again formed by a plurality of transverse, or diagonal, elements in the same way as the transverse of diagonal elements of FIG. 1.

Figure 3:
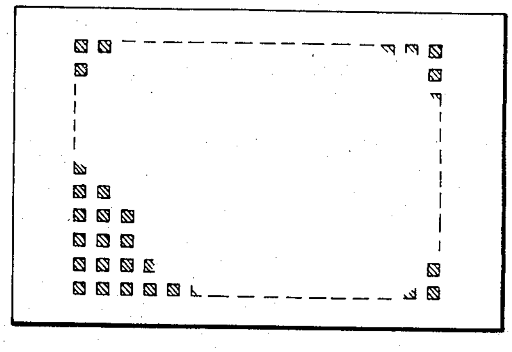
FIG. 3 is an enlarged view of a complementary screen suitable for use with the embodiment of FIG. 2.

FIG. 3 illustrates a complementary screen to be used in conjunction with the mask illustrated in FIG. 2, the operation of which will be described in greater detail below. Briefly, the complementary screen comprises a grid pattern of transparent lines corresponding to the grid pattern of opaque lines of the mask of FIG. 2.

Referring now to FIG. 4 there is shown a further embodiment in which the fiducial mark is in the form of two limited perpendicular lines of transverse elements. Each line is formed in exactly the same way as the line of elements of FIG. 1. In the case of FIG. 4 the magnification is in the region of 50 times life size. The transverse lines of elements may be arranged, as shown in FIG. 4, so that the elements extend throughout the whole length of each perpendicular line, or alternatively, the central region where the two lines intersect may be formed devoid of transverse elements.

Referring now to FIG. 5 there is shown one arrangement suitable for use with a mask as described with respect to any of FIGS. 1, 2 or 4. The mask, indicated 11, is located over a slice of semiconductor element 12 but slightly spaced therefrom so that the two can be illuminated with light from a lamp assembly 13 via an inclined semi-reflector 14. Light reflected from the mask and slice assembly is reflected by the semi-reflector 14 through a refractor block 15 to a lens 16 and falls on a screen 17 having a slit corresponding in shape and orientation to the fiducial mark on the mask 11. The light from the fiducial mark on the mask 11 and the corresponding mark on the slice 12 falls upon the slit in the screen 17 and passes therethrough to a photodetector 18. The screen 17 is vibrated by a device 22 which also produces a reference signal which is related in frequency and phase to the vibrations of the screen 17. The output of the photodetector 18 is thus a varying signal the amplitude of which depends on the alignment of the fiducial marks on the mask 11 and the slice 12. This signal is then compared with the reference signal from the device 22 in a comparator 23 to provide an error voltage which is used to adjust the positions of the mask and the slice until the fiducial marks are correctly aligned.

The embodiment illustrated in FIG. 6 is similar to the embodiment of FIG. 5 and corresponding reference numerals indicate corresponding components in each system. The screen 17 of FIG. 5 is, however, replaced by a rotating refractor plate 19 and an auxiliary mask 20. If, for example, the mask 11 is formed with a grid pattern of opaque fiducial marks as illustrated in FIG. 3, the auxiliary mask 20 will require to have a grid pattern of transparent lines as illustrated in FIG. 4. The refractor plate is rotated so that the light incident on the auxiliary mask 20 performs predetermined oscillations and the angular speed of rotation of the refractor plate 19 is controlled by a device 24 which produces an output reference voltage indicative of the angular velocity and phase of the refractor plate 19. A relay lens 21 is placed behind the auxiliary mask 20 and focuses the whole of the light incident on the mask 20 onto the photodetector 18. The output from the photodetector 18 is fed to a comparator 23 which is also fed with the output signal from the control device 24 to provide a varying error signal which is used to adjust the relative positions of the mask 11 and the semiconductor element 12 to align the two fiducial marks thereon. This system is beneficial, particularly with the use of a grid pattern of fiducial marks since it allows for an averaging effect over the whole of the mask to take place at the photodetector 18. Previously when a single fiducial mark was used to determine the location of the mask 11 and the slice 12 cumulative errors in the formation of the individual marks could lead to cumulative errors in the step-and-repeat process of pattern transference. In the present case however the whole of the mask is used for alignment at each step.

As discussed above it is preferred for the mask 11 to be in the form of a master having all of the patterns which are to be transferred to the slice at subsequent operations, there being provided a number of blanking or non-critical masks which modify the pattern depending on which particular pattern is to be transferred at any one stage. At the same time as the manufacture of the master mask and the non-critical masks the auxiliary mask 20 may be formed so that it corresponds exactly with the fiducial marks on the mask 11.

In this way errors due to the introduction of special fiducial marks are eliminated, and moreover when used in a photolithographic process as described above in which the exposed pattern is washed away with the developer to leave the masking layer exposed, since the fiducial marks on such a semiconductor element will take the form of a grid pattern of oxide removed from the surface of the slice after etching, and this assists in the subsequent process of scribing and breaking when the slice 12 has been processed and is being separated into individual devices. A further advantage of the fiducial marks in the form of a grid pattern is that there is no interference with the pattern to be transferred by the fiducial marks as they surround the pattern rather than extending across it.

We claim:

1. A mask bearing a pattern formed as variations in the reflectivity of transmissivity of the mask for reproduction on a layer of photosensitive material spaced from the mask by exposing said photosensitive layer to light reflected from or transmitted through said mask, wherein said mask also has at least one fiducial mark comprising means defining a plurality of elements the reflectivity or transmissivity of which is different from the surrounding parts of said mask, said elements being so arranged that, when illuminated, the diffraction effects at the edges of said elements cooperate to provide a single dense image of said fiducial mark.

2. The mask of claim 1 wherein said elements of said fiducial mark are shaped as elongate parallel lines arranged side by side in at least one row extending transverse the direction of said elements.

3. The mask of claim 2 wherein said elements are of such a size and so spaced that when they are illuminated said diffraction patterns of adjacent elements overlap and cancel to provide said single dense image of said fiducial mark.

4. The mask of claim 2 wherein said elongate elements are inclined to the direction of said row of said elements forming said fiducial mark.

5. The mask of claim 4 wherein said elements are inclined at 45° to said direction fo said row of said elements.

6. The mask of claim 2 wherein said fiducial mark comprises at least two rows of said elongate elements, the direction of said two rows being mutually perpendicular and said two rows intersecting, said elements of said two rows extending all in the same direction.

7. The mask of claim 6 wherein there are no means defining said elongate elements at said intersection of said two rows of said fiducial mark.

8. The mask of claim 2 wherein said fiducial mark comprises a plurality of rows of said elongate elements, said plurality of rows extending in two perpendicular directions and forming a grid on said mask, said elongate elements of said plurality of rows all extending in the same direction.

9. The mask of claim 8 wherein said pattern on said mask is formed solely in the interstices between rows of said grid of fiducial marks and is repeated in each of the interstices of said grid.

10. Apparatus for use in the manufacture of planar semi-conductors, comprising:

means for adjustably mounting an element of semiconductor material bearing a layer of photosensitive material thereon, in a given orientation, a mask bearing a pattern formed as variations in the transmissivity of said mask for reproduction on said layer of photosensitive material by exposing said layer of photosensitive material to light transmitted through said mask, said mask also having at least one fiducial mark comprising means defining a plurality of elements the transmissivity of which is different from that of the surrounding parts of said mask, said elements being so arranged that when said mask is illuminated the diffraction effects at the edges of said elements cooperate to provide a single dense image of said fiducial mark, means for mounting said mask spaced from said element of semiconductor material in a predetermined relative orientation therewith, means for illuminating the mask with radiation of a wavelength to which the photosensitive layer is insensitive so that light transmitted through said mask falls on said element, and means sensitive to the relative positions of the image of said fiducial mark on said semiconductor element, and a fiducial mark previously formed on said semiconductor element to effect automatically alignment of said two fiducial marks.

11. The apparatus of claim 10 wherein said means sensitive to said relative positions of said two fiducial marks includes at least one photoelectric detector in front of which there is located a screen having fiducial marks formed as variations in the transmissivity thereof which are complementary to the variations in the transmissivity of said mask which form said fiducial marks.

12. The apparatus of claim 11 wherein said elements of said fiducial mark on said mask are formed as opaque regions in a transparent mask, and said complementary screen has a correspondingly shaped transparent region in an otherwise opaque screen.

13. The apparatus of claim 11 wherein there are further provided means for vibrating said complementary screen transverse the direction of incident light, and means for providing a reference signal the frequency and phase of which are related to the frequency and phase of vibration of said screen.

14. The apparatus of claim 11 wherein there is provided a prismatic refractor in the path of the light from said semiconductor element to said complementary screen, and means for rotating said refractor and providing a reference signal the frequency of which is related to the angular velocity of said refractor.

15. The apparatus of claim 14 wherein said prismatic refractor is in the form of a parallel sided plate inclined with respect to the direction of incident light from said semiconductor element.

16. The apparatus of claim 11, wherein said fiducial mark on said mask is in the form of a grid pattern of elements and said fiducial mark on said complementary screen is in the form of a corresponding grid pattern of openings.

17. The apparatus of claim 16, further comprising a lens between said complementary screen and said photoelectric detector for focusing substantially the whole of the light transmitted through said screen onto said photoelectric detector.

18. The apparatus of claim 11 wherein there are provided two separate fiducial marks on said mask and two photo detectors for sensing the alignment of said two fiducial marks on said mask with two separate fiducial marks on said semi-conductor element.

* * * * *